(12) United States Patent
Nouri et al.

(10) Patent No.: US 9,352,389 B2
(45) Date of Patent: May 31, 2016

(54) DIRECTIONAL SOLIDIFICATION SYSTEM AND METHOD

(75) Inventors: Abdallah Nouri, Brampton (CA); Kamel Ounadjela, Belmont, CA (US)

(73) Assignee: Silicor Materials, Inc., San Jose, CA (US)

( * ) Notice: Subject to any disclaimer, the term of this patent is extended or adjusted under 35 U.S.C. 154(b) by 0 days.

(21) Appl. No.: 13/234,960

(22) Filed: Sep. 16, 2011

(65) Prior Publication Data

US 2012/0067540 A1 Mar. 22, 2012

(51) Int. Cl.
| | | |
|---|---|---|
| *C30B 35/00* | (2006.01) | |
| *B22D 27/04* | (2006.01) | |
| *C30B 29/36* | (2006.01) | |
| *C30B 23/02* | (2006.01) | |
| *C30B 23/00* | (2006.01) | |
| *C01B 33/037* | (2006.01) | |
| *C30B 11/00* | (2006.01) | |
| *C30B 29/06* | (2006.01) | |

(52) U.S. Cl.
CPC ............ *B22D 27/045* (2013.01); *C01B 33/037* (2013.01); *C30B 11/002* (2013.01); *C30B 11/003* (2013.01); *C30B 23/00* (2013.01); *C30B 23/025* (2013.01); *C30B 29/06* (2013.01); *C30B 29/36* (2013.01)

(58) Field of Classification Search
CPC ........ C30B 29/36; C30B 23/00; C30B 23/025
USPC .................................. 117/200, 206, 217, 222
See application file for complete search history.

(56) References Cited

U.S. PATENT DOCUMENTS

| | | | |
|---|---|---|---|
| 3,752,638 A | 8/1973 | Van Laar et al. | |
| 5,254,300 A | 10/1993 | Priewasser et al. | |
| 5,553,656 A * | 9/1996 | Cook | 164/66.1 |
| 5,961,944 A * | 10/1999 | Aratani et al. | 423/348 |
| 6,136,091 A * | 10/2000 | Yamazaki et al. | 117/81 |
| 6,378,835 B1 * | 4/2002 | Wakita et al. | 249/78 |
| 6,712,904 B1 * | 3/2004 | Sonnenberg et al. | 117/222 |
| 8,268,074 B2 | 9/2012 | Hugo | |
| 8,562,740 B2 * | 10/2013 | Nichol et al. | 117/206 |
| 2004/0187767 A1 * | 9/2004 | Chandra et al. | 117/13 |
| 2006/0000409 A1 * | 1/2006 | Spangler et al. | 117/81 |

(Continued)

FOREIGN PATENT DOCUMENTS

| | | |
|---|---|---|
| CN | 101133191 A | 2/2008 |
| CN | 101928003 A | 12/2010 |

(Continued)

OTHER PUBLICATIONS

"European Application Serial No. 12766799.6, Office Action mailed May 8, 2014", 2 pgs.
"European Application Serial No. 12766799.6, Response filed Oct. 14, 2014 to Office Action mailed May 8, 2014", 6 pgs.

(Continued)

*Primary Examiner* — Matthew Song
(74) *Attorney, Agent, or Firm* — Schwegman Lundberg & Woessner, P.A.

(57) ABSTRACT

The present invention relates to an apparatus and method for purifying materials using a rapid directional solidification. Devices and methods shown provide control over a temperature gradient and cooling rate during directional solidification, which results in a material of higher purity. The apparatus and methods of the present invention can be used to make silicon material for use in solar applications such as solar cells.

9 Claims, 7 Drawing Sheets

(56) References Cited

U.S. PATENT DOCUMENTS

| | | | |
|---|---|---|---|
| 2007/0227189 A1* | 10/2007 | Sakai | 65/83 |
| 2008/0257254 A1 | 10/2008 | Linke et al. | |
| 2009/0020067 A1* | 1/2009 | Su et al. | 117/3 |
| 2009/0158995 A1* | 6/2009 | Lew | 117/200 |
| 2010/0203350 A1* | 8/2010 | Stoddard et al. | 428/620 |
| 2010/0294198 A1* | 11/2010 | Wan | 117/223 |
| 2011/0259316 A1* | 10/2011 | Pelletier et al. | 126/343.5 R |
| 2012/0040139 A1 | 2/2012 | Garandet et al. | |
| 2012/0119407 A1 | 5/2012 | Nichol et al. | |

FOREIGN PATENT DOCUMENTS

| | | |
|---|---|---|
| CN | 102080259 A | 6/2011 |
| CN | 102701213 A | 10/2012 |
| DE | 19912484 A1 | 9/2000 |
| EP | 0939146 A1 | 9/1999 |
| JP | 2015534401 A | 12/2014 |
| TW | 201447056 A | 12/2014 |
| WO | WO 2008086705 A1 * | 7/2008 |
| WO | WO 2010069784 A1 * | 6/2010 |
| WO | WO-2011009062 A2 | 1/2011 |
| WO | WO-2012/025905 A1 | 3/2012 |
| WO | WO-2013/040410 A1 | 3/2013 |
| WO | WO-2014/140901 A2 | 9/2014 |
| WO | WO-2014140901 A3 | 9/2014 |

OTHER PUBLICATIONS

"International Application Serial No. PCT/IB2014/001147, International Search Report mailed Nov. 7, 2014", 5 pgs.

"International Application Serial No. PCT/IB2014/001147, Written Opinion mailed Nov. 7, 2014", 10 pgs.

"International Application Serial No. PCT/US2012/055510, International Preliminary Report on Patentability mailed Mar. 27, 2014", 7 pgs.

Kwiecinska, B., et al., "Graphite, semi-graphite, natural coke, and natural char classification—ICCP system", *International Journal of Coal Geology*, 57(2), (2004), 99-116.

Chinese Application Serial No. 201280044634.6, Office Action mailed Jun. 24, 2015, (w/ English Translation), 15 pgs.

International Application Serial No. PCT/IB2014/001147, International Preliminary Report on Patentability mailed Sep. 24, 2015, 11 pgs.

Korean Application Serial No. 10-2015-7029004, Office Action mailed Oct. 13, 2015, 4 pgs.

"International Application Serial No. PCT/US2012/055510, International Search Report mailed Dec. 14, 2012", 4 pgs.

"International Application Serial No. PCT/US2012/055510, Written Opinion mailed Dec. 14, 2012", 5 pgs.

"Chinese Application Serial No. 201280044634.6, Response filed Jan. 4, 2016 to Office Action mailed Jun. 24, 2015", (w/ English Translation of Claims), 22 pgs.

* cited by examiner

DIRECTIONAL SOLIDIFICATION SYSTEM AND METHOD

BACKGROUND

Solar cells can be a viable energy source by utilizing their ability to convert sunlight to electrical energy. Silicon is a semiconductor material and the raw incoming material used in the manufacture of solar cells; The electrical properties of the cells, namely the conversion efficiency depends critically on the purity of the Silicon. Several techniques have been used to purify Silicon. The most well known technique is called 'Siemens process'. This technique allows to almost remove every single impurity present within the Silicon. However, this technique requires to produce the silicon into a gas phase and redeposit into a solid phase in order to remove the impurities. The technique describes in this patent allows to remove very effectively impurities by melting the Silicon into a liquid phase and solifying the Silicon using a technique called 'directional solidification'. White this technique is very well known, this patent focuses on a new way to use the directional solification that allows to reduce considerably the cost of this procedure.

Techniques used to make purified silicon crystals for solar cells are known. Most of these techniques operate on the principle that while silicon crystals are solidifying from a molten silicon solution, undesirable impurities remain in the molten solution. A first example technique, the float zone technique, can be used to make silicon monocrystalline ingots using a moving liquid to urge impurities toward an edge of a mold for removal. Another example technique, the Czochralski technique, can be used to make silicon monocrystalline ingots using a seed crystal that is slowly pulled out of a molten solution, allowing the formation of a monocrystalline column of silicon while leaving impurities in the solution. Further example techniques, such as the Bridgeman or heat exchanger techniques, can be used to make silicon multicrystalline ingots through the creation of a temperature gradient with a controlled cooling rate, causing directional solidification.

OVERVIEW

Various techniques for making silicon crystals for solar cells utilize a mold to hold silicon during the molten manufacturing stage. One challenge with directional solidification of multicrystalline ingots is maintaining consistent progression of a liquid-solid interface with a flat shape or concave with a small deflection from the bottom of the mold to the top. If the progression of the liquid-solid interface is not controlled, impurities can become trapped in the ingot, and a large amount of the solidified silicon may end up with lower performance, or unacceptable performance as a result.

The present molds, mold systems, and related methods provide means for purifying silicon using directional solidification. The molds, mold systems, and related methods allow for control over a temperature gradient during directional crystallization, which can result in silicon of higher purity for use in solar cells. A mold can include an outer jacket, a base lining a bottom portion of the outer jacket, and a wall insulation structure lining a wall of the outer jacket. The base can include a heat-conducting material. The wall insulation structure can taper in thickness from a top portion of the mold, having a first thickness, to a bottom portion of the mold, having a second thickness that is thinner than the first thickness. The wall insulation structure can include one or more of an exposed layer, refractory bricks, ceramic fiber, and a microporous refractory layer.

To better illustrate the molds, mold systems, and related methods disclosed herein, a non-limiting list of examples is now provided:

In Example 1, a system for directional solidification includes an outer jacket, abase lining a bottom of the outer jacket, the base including a heat conducting material, and a wall insulation structure lining a wall of the outer jacket, the wall insulation structure tapering in thickness from a rim of the mold, having a first thickness, to a bottom portion of the mold, having a second thickness that is thinner than the first thickness.

In Example 2, the system of Example 2 is optionally configured such that the wall insulation structure tapers in thickness from a rim of the mold to a bottom interface with the base.

In Example 3, the system of any one or any combination of Examples 1-2 is optionally configured such that the second thickness is approximately 25 percent thinner than the first thickness.

Example 4, the system of any one or any combination of Examples 1-3 is optionally configured such that the wall insulation structure includes a layer of refractory bricks, and an exposed layer of substantially continuous refractory material.

In Example 5, the system of any one or any combination of Examples 1-4 is optionally configured such that the exposed layer includes a layer of $Al_2O_3$.

In Example 6, the system of any one or any combination of Examples 1-5 is optionally configured such that the exposed layer is greater than about 98 percent pure $Al_2O_3$.

In Example 7, the system of any one or any combination of Examples 1-6 is optionally configured such that the layer of refractory bricks is rated between approximately 1540° C. to 1430° C.

In Example 8, the system of any one or any combination of Examples 1-7 is optionally configured such that the exposed layer tapers in thickness from a wide portion at the rim of the mold, to a thinner portion at the bottom interface with the base, and the layer of refractory bricks tapers in thickness from a wide portion at the rim of the mold, to a thinner portion at the bottom interface with the base.

In Example 9, the system of any one or any combination of Examples 1-8 is optionally configured such that the wall insulation structure further includes a microporous refractory layer.

In Example 10, the system of any one or any combination of Examples 1-9 is optionally configured such that the microporous refractory layer has a uniform thickness.

In Example 11, the system of any one or any combination of Examples 1-10 is optionally configured such that the microporous refractory layer provides a substantially uniform thickness along the wall of the outer jacket, and at least part of the bottom of the outer jacket.

In Example 12, the system of any one or any combination of Examples 1-11 is optionally configured such that the wall insulation structure further includes a ceramic fiber layer between the microporous refractory layer and the layer of refractory bricks.

In Example 13, the system of any one or any combination of Examples 1-12 is optionally configured such that the wall insulation structure further includes a ceramic fiber layer between the microporous refractory layer and the outer jacket.

Example 14, the system of any one or any combination of Examples 1-13 is optionally configured such that the base includes a layer of silicon carbide.

In Example 15, the System of any One or any Combination of Examples 1-14 is optionally configured such that the system further includes a top heater.

In Example 16, the system of any one or any combination of Examples 1-15 is optionally configured such that the top heater includes 12 heating elements.

Example 17, the system of any one or any combination of Examples 1-16 is optionally configured such that the heating elements are equally spaced apart over a distance of approximately 54 inches.

In Example 18, the system of any one or any combination of Examples 1-17 is optionally configured such that a lower edge of the heating elements is positioned to be spaced above a surface of a melt by a distance of approximately 1.9 inches.

In Example 19, the system of any one or any combination of Examples 1-18 is optionally configured such that the heating elements include silicon carbide heating elements.

In Example 20, the system of any one or any combination of Examples 1-19 is optionally configured such that the system further includes a vent hole in the top heater.

In Example 21, the system of any one or any combination of Examples 1-20 is optionally configured such that the vent hole includes an approximately one inch diameter hole in a center of the top heater, and there is only a single vent hole in the top heater.

In Example 22, a mold for directional solidification includes a substantially rectangular shaped wall structure, including a long side and a short side, a heat conducting base, coupled to the substantially rectangular shaped wall structure, and wherein the substantially rectangular shaped wall is dimensioned to provide a wall contact area for a given quantity of molten silicon that is less than a wall contact area for a cylindrical mold having a diameter substantially equal to a length of the short side of the mold.

In Example 23, the mold of Example 22 is optionally configured such that the rectangular shaped wall structure includes a rounded profile at wall intersections.

In Example 24, the system of any one or any combination of Examples 22-23 is optionally configured such that an intersection of the rectangular shaped wall structure and the bottom includes a rounded profile.

In Example 25, a system for directional solidification of silicon, includes a mold to contain a volume of molten silicon, including a heat insulating wall structure, and a heat conducting base, a support structure spacing the mold above a floor surface, and defining a space between the mold and the floor, one or more flow pathways to move air within the space, and one or more valves to adjust a flow through the one or more flow pathways.

In Example 26, the mold of Example 25 is optionally configured such that the system further includes a top heater.

In Example 27, the system of any one or any combination of Examples 25-26 is optionally configured to further include a fan to move air within the space.

In Example 28, the system of any one or any combination of Examples 25-27 is optionally configured to further include a number of cooling fins thermally coupled to the heat conducting base within the space.

In Example 29, the system of any one or any combination of Examples 25-28 is optionally configured such that the heat conducting base includes a metal heat spreading layer coupled to the number of cooling fins.

In Example 30, the system of any one or any combination of Examples 25-29 is optionally configured such that the heat conducting base includes a silicon carbide layer.

In Example 31, the system of any one or any combination of Examples 25-30 is optionally configured such that the one or more valves includes a movable wall sized to cover both the heat insulating wall structure and the space between the floor and the mold.

In Example 32, the system of any one or any combination of Examples 25-31 is optionally configured such that the one or more valves includes a movable wall sized to cover the heat insulating wall structure, an interface between the mold and the top heater, and the space between the floor and the mold.

In Example 33, a system for directional solidification of silicon, includes an outer jacket, a silicon carbide layer lining a bottom of the outer jacket, and a composite wall insulation structure lining a wall of the outer jacket, wherein the composite wall insulation structure includes a first ceramic fiber layer adjacent to a wall of the outer jacket, a microporous refractory layer adjacent to the first ceramic fiber layer, a second ceramic fiber layer adjacent to the microporous refractory layer, a layer of refractory bricks adjacent to the second ceramic fiber layer, a substantially continuous aluminum oxide layer adjacent to the layer of refractory bricks, the aluminum oxide layer forming an exposed interior surface of the composite wall insulation structure, wherein the composite wall insulation structure tapers in thickness from a rim of the mold, having a first thickness, to a bottom interface with the silicon carbide layer, having a second thickness that is thinner than the first thickness, a top heater to fit over a top of the mold, the top heater including, a plurality of silicon carbide heating elements, a vent hole, and a vacuum pump coupled to the vent hole to remove gasses from a surface of silicon during a cooling operation.

In Example 34, the system of Example 33 is optionally configured such that the outer jacket includes a stainless steel outer jacket.

In Example 35, the system of any one or any combination of Examples 33-34 is optionally configured such that the second thickness is approximately 25 percent thinner than the first thickness.

In Example 36, the system of any one or any combination of Examples 33-35 is optionally configured such that the substantially continuous aluminum oxide layer includes a greater than about 98 percent pure $Al_2O_3$ layer.

In Example 37, a directional solidification system, includes an outer jacket, a base lining a bottom of the outer jacket, the base including a heat conducting material, a wall insulation structure lining a wall of the outer jacket, wherein the wall insulation structure tapers in thickness from a rim of the mold, having a first thickness, to a bottom interface with the base, having a second thickness that is thinner than the first thickness, wherein the mold is rectangular in shape, with a wall that is dimensioned to provide a wall contact area for a given quantity of molten silicon that is less than a wall contact area for a cylindrical mold having a diameter substantially equal to a length of the short side of the mold, a removable top heater, a support structure spacing the mold above a floor surface, and defining a space between the mold and the floor, one or more flow pathways to move air within the space, and one or more valves to adjust a flow through the one or more flow pathways.

In Example 38, the system of Example 37 is optionally configured such that the base of the mold includes a metal heat spreading layer coupled to a number of cooling fins that extend into the space between the mold and the floor.

In Example 39, a system for directional solidification, includes an outer jacket, abuse lining a bottom of the outer jacket, the base including a heat conducting material, a wall insulation structure lining a wall of the outer jacket, and a removable heat spreader coupled to the bottom of the outer jacket.

In Example 40, the system of Example 39 is optionally configured such that the wall insulation structure tapers in thickness from a rim of the mold, having a first thickness, to a bottom portion of the mold, having a second thickness that is thinner than the first thickness.

In Example 41, the system of any one or any combination of Examples 39-40 is optionally configured to further include a number cooling fins coupled to the removable heat spreader.

In Example 42, the system of any one or any combination of Examples 39-41 is optionally configured such that the outer jacket is substantially cylindrical in shape.

In Example 43, the system of any one or any combination of Examples 39-42 is optionally configured such that the outer jacket is substantially rectangular in shape.

These and other examples and features of the present molds, mold systems, and related methods will be set forth in part in the following detailed description. This overview is intended to provide non-limiting examples of the present subject matter—it is not intended to provide an exclusive or exhaustive explanation. The detailed description below is included to provide further information about the present molds, mold systems, and methods.

BRIEF DESCRIPTION OF THE DRAWINGS

In the drawings, like numerals can be used to describe similar elements throughout the several views. Like numerals having different letter suffixes can be used to represent different views of similar elements. The drawings illustrate generally, by way of example, but not by way of limitation, various embodiments discussed in the present document.

DETAILED DESCRIPTION

Figure 1:
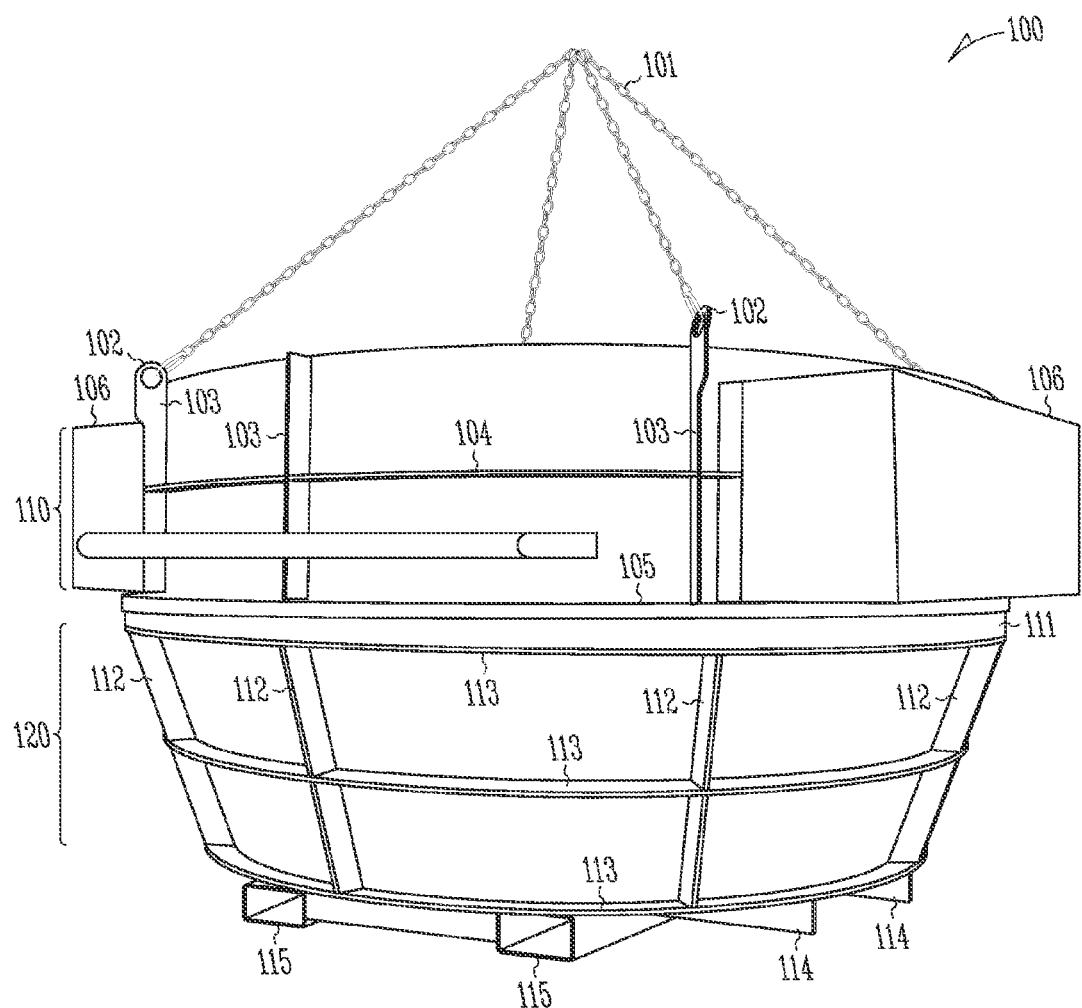
FIG. 1 shows an isometric view of a system according to at least one embodiment of the invention.

In the following detailed description, reference is made to the accompanying drawings. The drawings form a part of the description and are provided by way of illustration, but not of limitation. The drawing embodiments are described in sufficient detail to enable those skilled in the art to practice the present subject matter. Other embodiments may be utilized and mechanical, structural, or material changes may be made without departing from the scope of the present patent document.

Reference will now be made in detail to certain examples of the disclosed subject matter, some of which are illustrated in the accompanying drawings. White the disclosed subject matter will largely be described in conjunction with the accompanying drawings, it should be understood that such descriptions are not intended to limit the disclosed subject matter to those drawings. On the contrary, the disclosed subject matter is intended to cover all alternatives, modifications, and equivalents, which can be included within the scope of the presently disclosed subject matter, as defined by the claims.

References in the specification to "one embodiment", "an embodiment", "an example embodiment", etc., indicate that the embodiment described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In this document, the terms "a" or "an" are used to include one or more than one and the term "or" is used to refer to a nonexclusive "or" unless otherwise indicated. In addition, it is to be understood that the phraseology or terminology employed herein, and not otherwise defined, is for the purpose of description only and not of limitation.

The present subject matter relates to molds, mold systems, and related methods for purifying silicon using directional solidification techniques, while maintaining a consistent progression of a solid-liquid interface throughout a mold. The purified silicon resulting from the directional solidification can be used in solar cells. It has been found that by controlling the temperature gradient within the mold, a highly controlled directional solidification can be accomplished. Although purification of silicon is described in the most detail in examples below, systems and methods described can also be used for directional solidification and purification of other materials such as sapphire.

Directional crystallization generally proceeds from bottom to top, thus the desired temperature gradient has a lower temperature at the bottom and a higher temperature at the top. High degrees of control over the temperature gradient and the corresponding directional crystallization can advantageously allow a more effective directional solidification, resulting in silicon of higher purity.

FIG. 1 illustrates a specific embodiment of a mold system 100 for directional solidification of silicon. The system can include a top heater 110 positioned on or near a top portion of a mold 120. The top heater 110 can be support by one or more chains 101, which are engaged on first ends with holes 102 of vertical structural members 103. The chains 101 in this example form a bridle, allowing the top heater 110 to be moved by the use of a crane or other lifting system. The system 100 can also be moved, for example, by placing the mold 120 on a fork or scissor lift while leaving the top heater 110 over the mold 120. Screen boxes 106 can enclose ends of the top heater's 110 heating members that protrude from an outer jacket, protecting users from the heat and electricity present in and near the ends of these members.

The vertical structural members 103 can extend from a bottom edge of the top heater 110 to a top edge of the top heater 110. The vertical structural members 103 can be located on an outer surface of the top heater's 110 outer jacket and can extend outward in a direction perpendicular to the outer surface. The top heater can also include a horizontal structural member 104 located on the outer surface of the top heater's 110 outer jacket and can extend outward in a direction perpendicular to the outer surface.

The top heater 110 can include a lip 105 that forms apart of the heater's outer jacket. The lip can protrude outward from the outer jacket and can extend inward toward a center axis of the top heater 110 such that it covers a thickness of any present insulation. Alternatively, the lip 105 can extend inward only, enough to cover the bottom edge of the top heater's 110 outer jacket.

Figure 11:
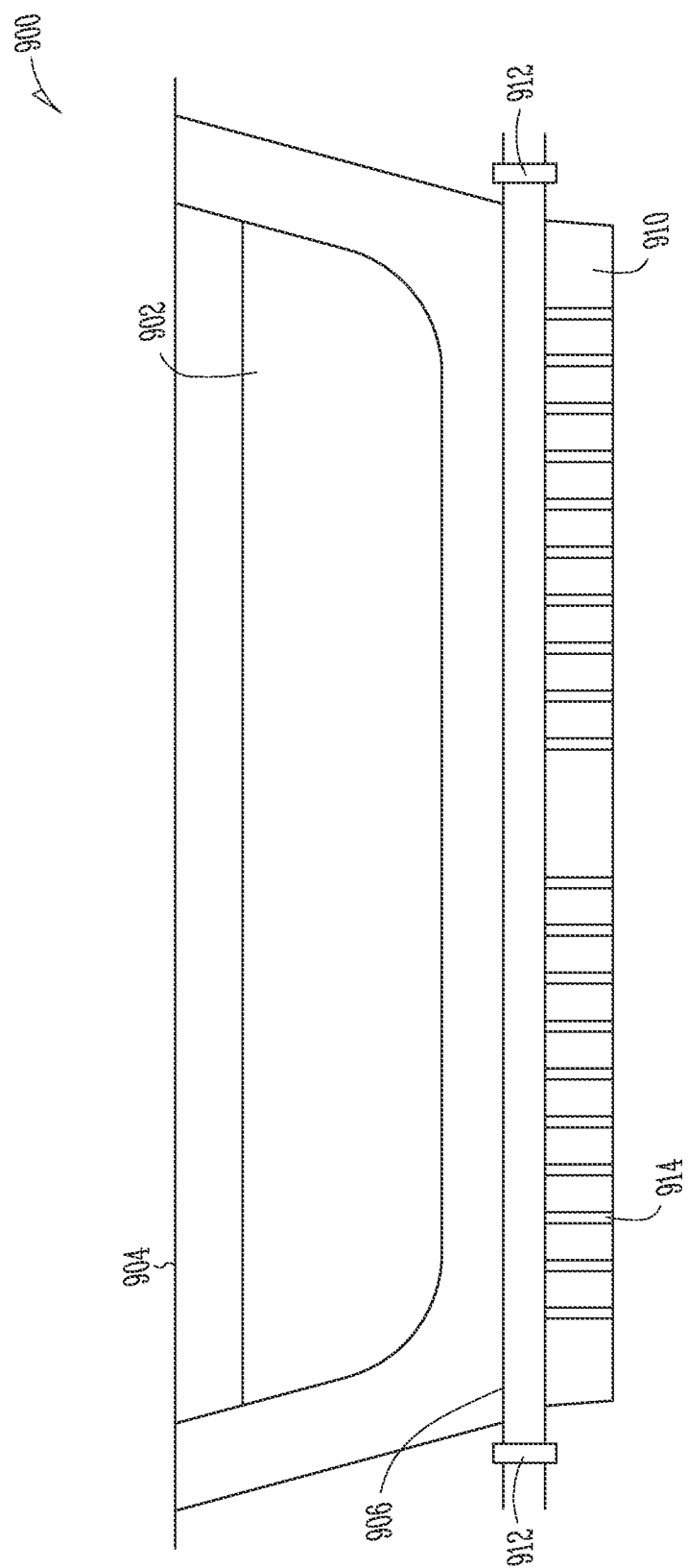
FIG. 11 shows a system according to at least one embodiment of the invention.

In the embodiment depicted in FIG. 11 insulation 111 from the mold 120 can extend between the top heater 110 and the mold 120. In various examples, at least part of one or more insulating layers 111 of the mold 120 can extend above the height of the mold's outer jacket. Similar to the top heater 110, the mold 120 can include vertical structural members 112. The vertical structural members 112 can be located on an outer surface of the mold's 120 outer jacket and can extend outward in a direction perpendicular to the outer surface. The vertical structural members 112 can extend from the bottom edge of the mold 120 to the top edge of the mold 120. The mold 112 can also include one or more horizontal structural members 113. The horizontal structural members 113 are shown on the outer surface of the outer jacket of the mold 120, extending outward from the outer jacket. The horizontal structural members 113 can extend horizontally around a circumference of a cylindrical mold 112 or along one or more sides of a non-cylindrical mold. The mold 112 can also include criss-crossing bottom structural members 114, 115. The bottom structural members 114, 115 can extend across the bottom of the mold 112. Some of the bottom structural members 115 can be shaped and sized to allow a fork or scissors lift or other machine to physically manipulate (e.g., move) the system 100.

Figure 2:
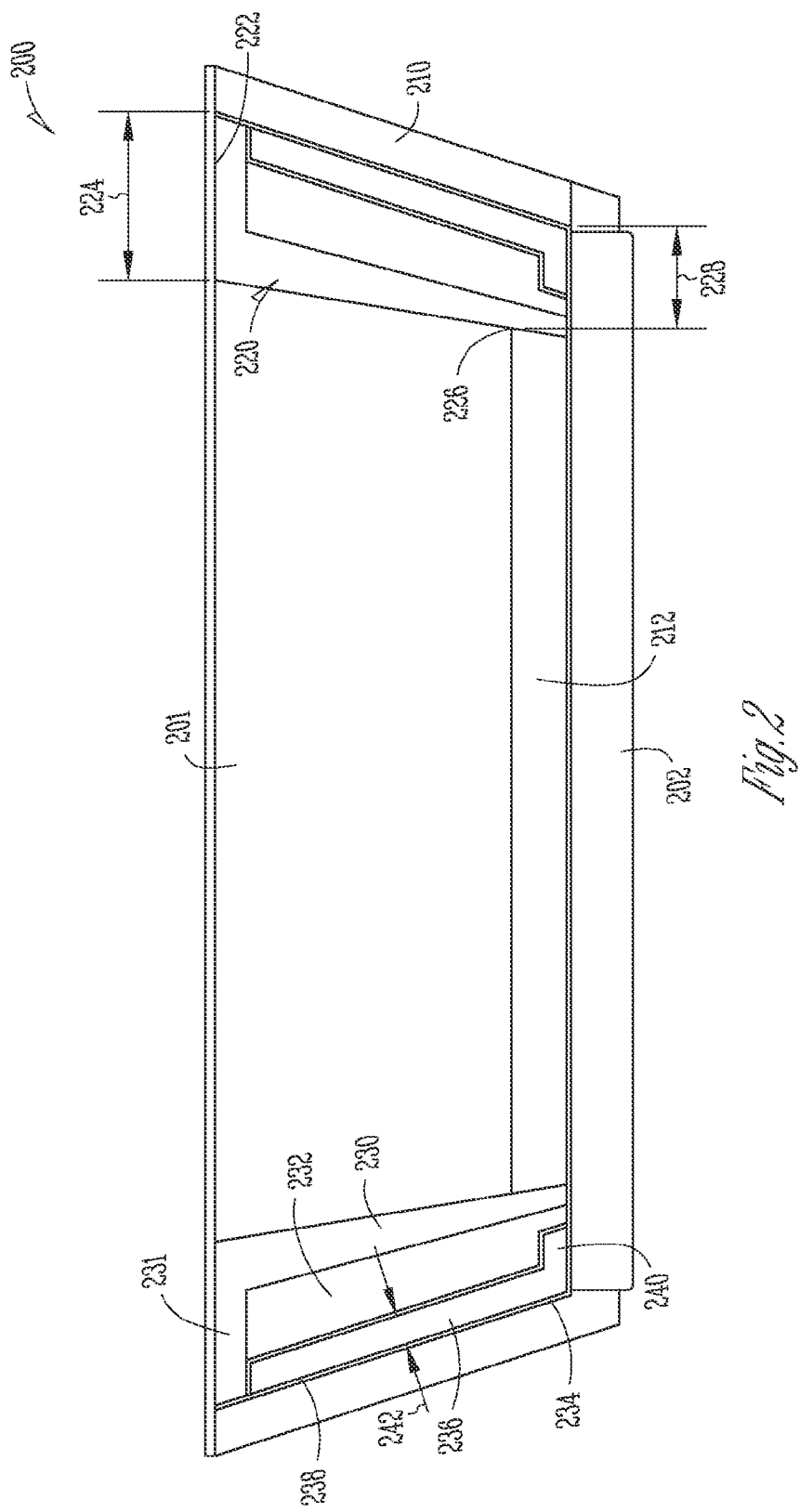
FIG. 2 shows a cross section of a mold according to at least one embodiment of the invention.

FIG. 2 shows a mold 200 according to an embodiment of the invention. The mold 200 includes an outer jacket 210, including side walls 201 and a floor 202, that encloses a bottom material 212 and a wall insulation structure 220. In one example, the side walls 201 and the floor 202 are integrally formed. In another example, the side walls 201 and the floor 202 are bolted, or otherwise mechanically connected together to form the outer jacket 210.

The mold 200 defines an interior portion 201 within the mold 200 to contain an amount of molten silicon. In one example, the wall insulation structure 220 is a composite structure including a number of different materials positioned next to each other. One advantage of a composite wall insulation structure 220 includes the ability to control a thermal gradient by selection of materials and geometry of the individual components of the composite structure. Another advantage of a composite wall insulation structure 220 includes the ability to reduce cost of the mold. Higher cost, high heat resistance materials are used on exposed surfaces where molten will be contacted, while lower cost materials with lower heat resistance are layered as the composite structure progresses away from the molten silicon.

In one example, the wall insulation structure 220 tapers in thickness from a rim 222 of the mold 200, having a first thickness 224, to a bottom interface 226 with the base 212, having a second thickness 228 that is thinner than the first thickness 224. In one example the second thickness is approximately 25 percent thinner than the first thickness. In operation, the taper of the wall insulation structure 220 provides a thermal gradient that provides a desirable progression of the liquid-solid interface in the silicon during directional solidification. In one example, the taper of the wall insulation structure 220 provides more insulation near a top of the melt to keep the surface of the melt in a liquid state, while less insulation is provided near the bottom interface with the base 212, to facilitate cooling at the bottom of the mold 200. More detailed results of the thermal gradient are discussed below, regarding FIG. 5.

In one example, the wall insulation structure 220 includes an exposed layer 230 that will be in direct contact with the molten silicon in a directional solidification operation one example, the exposed layer 230 is substantially continuous (in contrast, to an assembled brick layer or the like) to contain the molten silicon. One material that includes good thermal properties includes aluminum oxide in a form such as $Al_2O_3$. In one example, the aluminum oxide is substantially pure $Al_2(i)_3$, which minimizes impurities from the exposed layer 230 into the silicon melt. Due to the ionic nature of the bond structure in $Al_2O_3$, aluminum stays in exposed layer 230, and is not released as an impurity into the melt. In one example, the $Al_2O_3$ is greater than 98 percent pure $Al_2O_3$. In one example, the exposed layer 230 wraps over a top surface 231 of the wall insulation structure 220. A feature of this configuration includes protection for inner structures or layers within the wall insulation structure 220 that may not have thermal resistance to temperatures as high as the exposed layer 230.

In one example, the wall insulation structure 220 further includes a layer of refractory bricks 232 forming an interface with the exposed layer 230. In one example, the layer of refractory bricks 232 include $Al_2O_3$. Refractory bricks 232 can provide desirable structural properties such as toughness to the wall insulation structure 220. In one example, the layer of refractory bricks 232 includes bricks that are rated to 1540° C. or less. In one example, the layer of refractory bricks 232 includes bricks that are rated to 1430° C. or less. A combination of properties are taken into consideration in selection of refractory bricks 232, such as thickness and thermal properties needed for the desired gradient of the molten silicon, and other properties such as cost, strength, and toughness.

In one example, the wall insulation structure 220 further includes a microporous refractory layer 236. In one example, the microporous refractory layer 236 is rated to 1000° C. or less. Pores in the microporous refractory layer 236 provide good insulating properties. In selected examples layers of ceramic fiber insulation are further included between selected layers. In one example, a first ceramic fiber layer 238 is included between the outer jacket 210 and the microporous refractory layer 236. In one example, a second ceramic fiber layer 234 is included between the microporous refractory layer 236 and the layer of refractory bricks 232. Examples of ceramic fiber layers include boards, flexible fabrics, or other configurations.

In one example one or more layers in the wall insulation structure 220 taper from a rim 222 of the wall insulation structure 220 to a bottom 226 of the wall insulation structure 220, where the wall insulation structure 220 forms an interface with the base 212. In the example shown in FIG. 2, both the exposed layer 230 and the layer of refractory bricks 232 taper from the rim 222 to the bottom 226, white the microporous refractory layer 236 maintains a consistent thickness 242. In one example the microporous refractory layer 236 maintains a consistent thickness 242 along the outer jacket 210, and also around a corner 240 over at least part of the bottom of the outer jacket 210. This configuration provides precise control of the cooling rate of the silicon.

In one example, the base 212 includes a silicon carbide material. Silicon carbide includes the desirable property of high thermal conductivity, with high heat resistance it conducts heat from the silicon melt out the bottom of the mold 200, without melting itself, or contaminating the silicon. With heat flowing out the bottom of the mold, to begin the directional solidification, wall insulation structure 220 design choices such as thicknesses, material choice, and tapers work together to provide the desired consistent progression of the liquid-solid interface from the bottom of the mold to the top.

Figure 3:
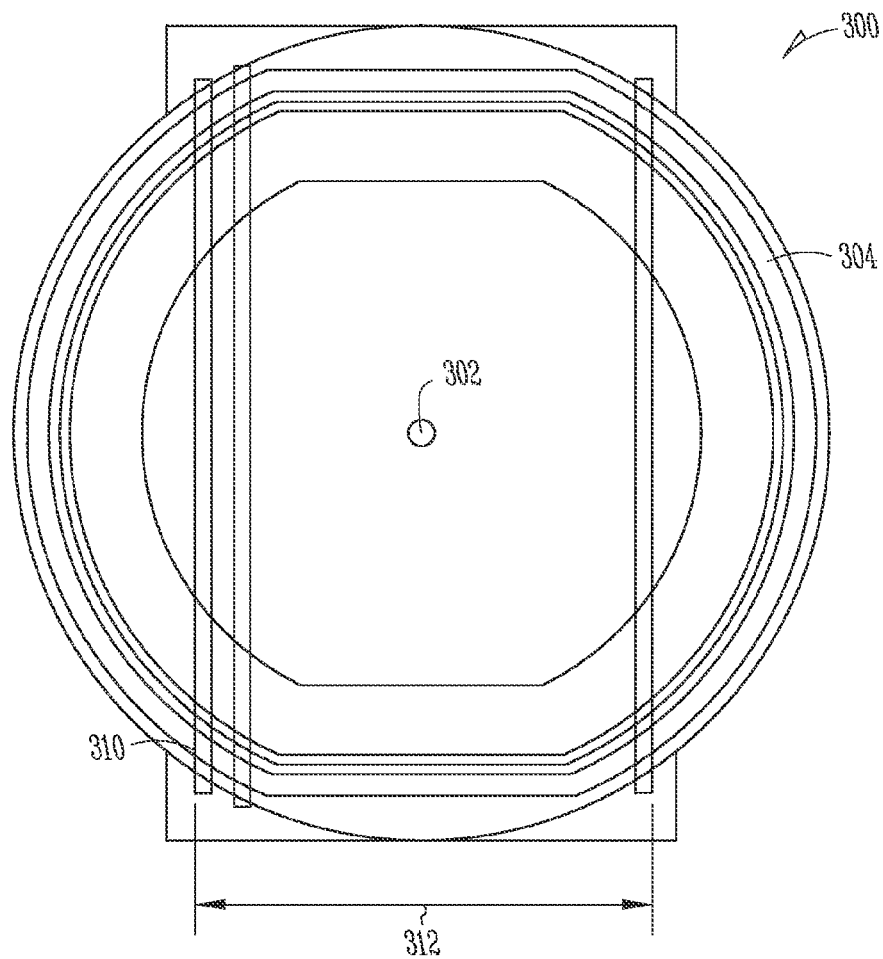
FIG. 3 shows a top view of a heater according to at least one embodiment of the invention.

FIG. 3 illustrates a top heater 300 that may further facilitate keeping a top surface of a silicon melt in a liquid state, white solidification desirably progresses from the bottom to the top of the mold. The top heater 300 can include one or more heating members 310. Each of the one or more heating members can independently include any suitable material. For example, each of the one or more heating members 310 independently can include a heating element, where the heating element can include silicon carbide, molybdenum disilicide, graphite, copper, or a combination thereof; and, each of the one or more heating members can alternatively independently include an induction heater. In one embodiment, the one or more heating members 310 are positioned at approximately the same height. In another embodiment, the one or more heating members are positioned at different heights.

In one example, the top heater 300 includes 12 heating members 310. In one example, the 12 heating members 310 are spaced approximately equally apart over a distance 312. In one example, the distance 312 is approximately 54 inches. Variables such as the positioning of heating members and the number of heating members are important to the thermal gradients generated in the silicon during processing. Small variations in the thermal gradient may cause undesirable (progression of portions of the liquid-solid interface in the silicon during directional solidification. For example it is undesirable to have a surface of the molten silicon solidify and trap a molten interior portion within the ingot. A trapped molten portion of silicon may contain an undesirable level of impurities that adversely affect performance of the resulting material.

In addition to a number of heating members 310 and a lateral spacing of heating members 310, in one example, the number of heating members 310 are positioned to be a distance 314 of approximately 1.9 inches above a surface of a melt. In one example, a diameter of the heating members 310 is approximately 2 inches. As with a selected number of heating members 310 and lateral spacing of heating members 310, chosen dimensions such as diameter of the heating members 310 and distance above a surface of a melt have been discovered in the present disclosure to provide a desirable progression of portions of the liquid-solid interface in the silicon during directional solidification.

In one example, a vent hole 302 is provided in the top heater 300 to remove gasses such as oxygen from the heating member 310 and a surface of the silicon melt. In one example, a vacuum pump (not shown) is coupled to the vent hole 302 to remove the unwanted gasses through the vent hole 302. In one example, only a single vent hole 302 sized between approximately one to two inches in diameter is used in the top heater 300. In one example, the single vent hole 302 is approximately one inch in diameter. It has been discovered that variables such as a single vent hole of appropriate dimensions effectively removes unwanted gasses without leading to unwanted cooling of a surface of the silicon melt.

In one example, the heating elements include silicon carbide, which has certain advantages. For example, silicon carbide heating elements do not corrode at high temperatures in the presence of oxygen. Oxygen corrosion can be reduced for heating elements including corrodible materials by using a vacuum chamber, but silicon cafbide heating elements can avoid corrosion without a vacuum chamber. Additionally, silicon carbide heating elements can be used without water-cooled leads, having multiple working zones, such as a cool zone at the edges, and a hot zone at the center of the heating element. In one embodiment, the heating elements are used in a vacuum chamber, with water-cooled leads, or both. In another embodiment, the heating elements are used without a vacuum chamber, without water-cooled leads, or without both.

In one embodiment, the one or more heating members 310 are induction heaters. The induction heaters can be cast into one or more refractory materials. The refractory material containing the induction heating coil or coils can then be positioned over the mold. The refractory material can be any suitable material. For example, the refractory material can include aluminum oxide, silicon oxide, magnesium oxide, calcium oxide, zirconium oxide, chromium oxide, silicon carbide, graphite, or a combination thereof. In another embodiment, the induction heaters are not cast into one or more refractory materials.

Figure 4:
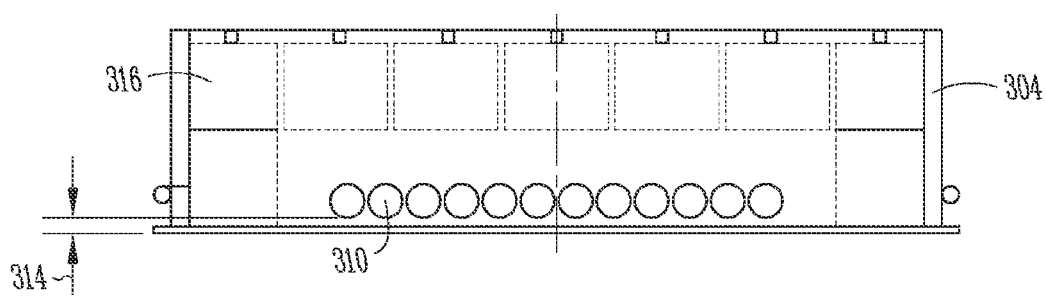
FIG. 4 shows a side view of a heater according to at least one embodiment of the invention.

The top heater can include insulation, for example top heater 300 shown in FIG. 4 includes insulation 316. The insulation can include any suitable insulating material. The insulation can include one or more insulating materials. For example, the insulation can include insulating brick, a refractory, a mixture of refractories, insulating board, ceramic paper, high temperature wool, cast insulating materials, or a mixture thereof. Insulating board can include high temperature ceramic board. In one example, the insulation 316 is cast around the heating members 310, making them more robust, and resistant to thermal shock to prevent deformation of parts around the heating members 310. One suitable cast material includes Kaolite® 3300 from Morgan Thermal Ceramics, Inc.

The top heater can include an outer jacket, for example top heater 300 shown in FIG. 3 includes outer jacket 304. The outer jacket can include any suitable material. For example, the outer jacket can include steel or stainless steel. In another embodiment, the outer jacket includes steel, stainless steel, copper, cast iron, a refractory material, a mixture of refractory materials, or a combination thereof. The insulation 316 is disposed at least partially between the one or more heating members and the outer jacket. In FIG. 4, the bottom edge of the outer jacket 304 is shown to be approximately even with the bottom edge of the insulation.

Variations in the top heater are possible, within the scope of the invention. For example, the edge of outer jacket 304 can extend below the edge of the insulation 316 and the one or more heating members 310. In another example, the edge of the outer jacket 304 can extend below the ° dr of the insulation 316, below the one or more heating members, or a combination thereof. In one example, the outer jacket 304 can extend below the bottom edge of the insulation 316 and continue across either fully or partially covering the bottom edge of the insulation. In some embodiments, the portion of the outer jacket 304 that covers the edge of the insulation can include a material with a relatively low conductivity, such as a suitable refractory, such as aluminum oxide, silicon oxide, magnesium oxide, calcium oxide, zirconium oxide, chromium oxide, silicon carbide, graphite, or a combination thereof. In another example, the outer jacket 304 does not extend below the bottom edge of the insulation or the height of the one or more heating members. In another embodiment, the outer jacket 304 extends below the height of the one or more heating members 310, but is still above the bottom edge of the insulation 316.

As discussed above, by controlling the temperature gradient in the apparatus, a highly controlled directional solidification can be accomplished. High degrees of control over the temperature gradient and the corresponding directional crystallization can allow a more effective directional solidification, providing a silicon of high purity. In the present invention, the directional crystallization proceeds from approximately bottom to top, thus the desired temperature gradient has a lower temperature at the bottom and a higher temperature at the top. In embodiments with a top heater, the top heater is one way to control the entry or loss of heat from the top of the directional solidification mold.

Figure 5:
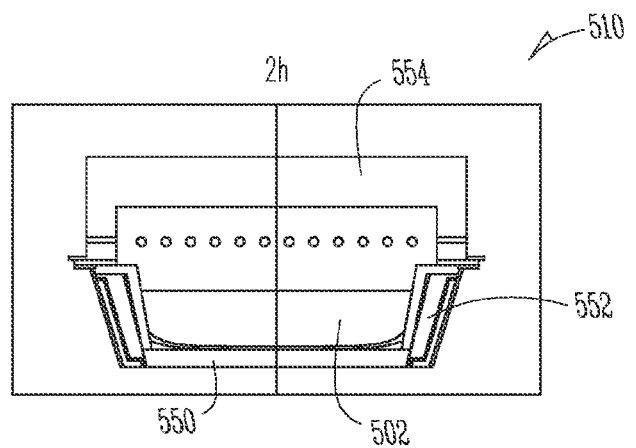
FIG. 5 shows a series of modeled cooling profiles for silicon using a mold according to at least one embodiment of the invention.
Figure 5:
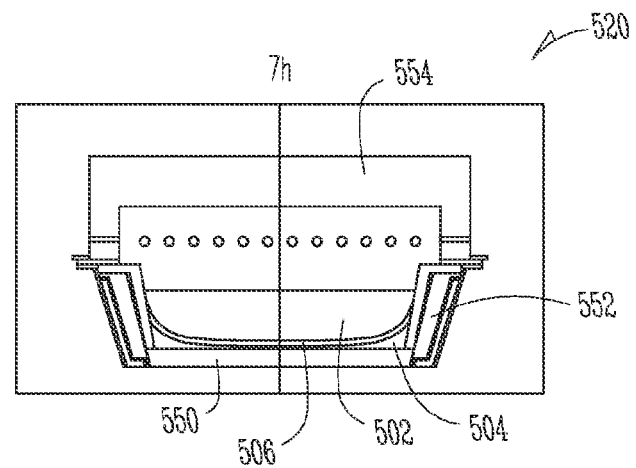
Figure 5:
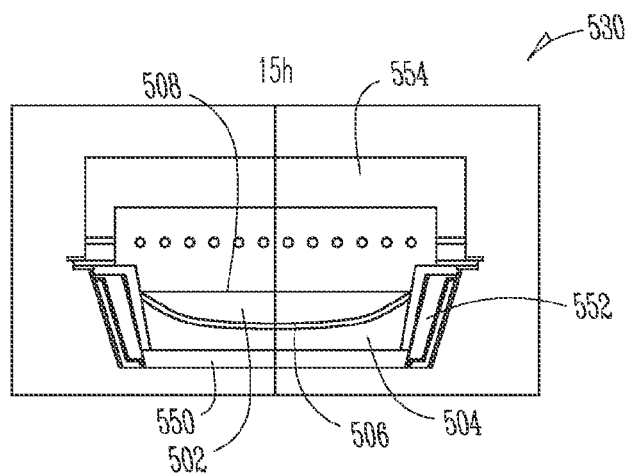

FIG. 5 shows a thermal model of directional solidification using a mold 550 and top heater 554 similar to embodiments such as mold 200 and top heater 300 described above. An amount of silicon is shown, contained in the mold 550, the silicon having a liquid portion 502, a solid portion 504, and a liquid-solid interface 506 progressing upward in the mold 550 desirably as described above.

Graph 510 of FIG. 5 shows the silicon at 2 hours into a directional solidification operation. Graph 520 of FIG. 5 shows the silicon at 7 hours into the directional solidification operation. The liquid-solid interface 506 is shown progressing upward into the liquid portion 502. Graph 530 of FIG. 5 shows the silicon at 15 hours into the directional solidification operation. The liquid-solid interface 506 is still progressing upward into the liquid portion 502, and a top surface 508 of the liquid portion 502 is still desirably in a liquid state, where impurities can collect, and be later removed, or example by sawing from the resulting ingot, or skimming the liquid portion 502 after an appropriate amount of time to allow a bulk of the solid portion 504 to form.

Figure 6:
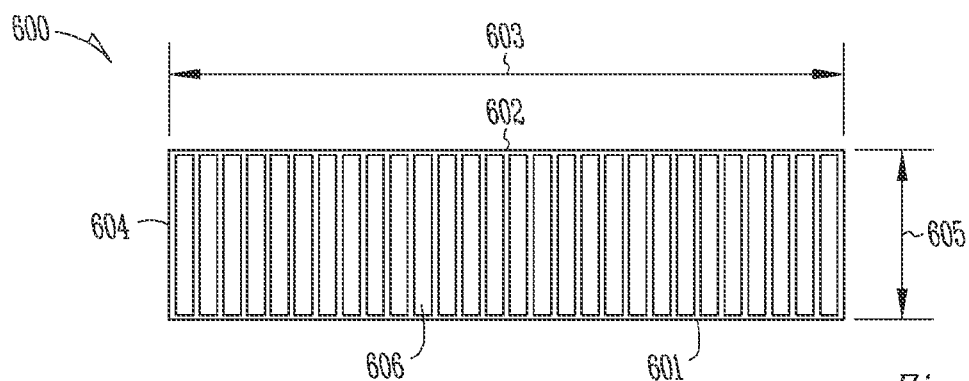
FIG. 6 shows a top view of a rectangular system according to at least one embodiment of the invention.

FIG. 6 shows a mold 600 according to another embodiment of the invention. The top view of the mold 600 shows a wall structure 601, including long side walls 602 and short side walls 604. In one example, both the tong side walls 602 and the short side walls 604 are formed from thermally insulating material, such as a refractory material. As discussed in embodiments, above, in one example, the refractory material includes aluminum oxide, substantially in the form $Al_2O_3$.

A number of heating elements 606 are shown in a configuration to be included within a rectangular top heater to cover the mold 600 during a directional solidification process one example the rectangular top heater can be used in a manner similar to the top heater described in FIGS. 3 and 4 above. Configurations of molds 600 and corresponding top heaters with a substantially rectangular shape have an advantage of improving efficiency and scatability of a directional solidification process.

Heating element 606 may include silicon carbide heating elements as described in embodiments above. Silicon carbide includes desirable properties such as electrical conductivity, and high heat resistance to provide resistive heating without melting or otherwise damaging the heating elements themselves. Heating elements 606 are commonly manufactured in linear segments. One common linear size of heating elements 606 includes 2 meter lengths.

Figure 7:
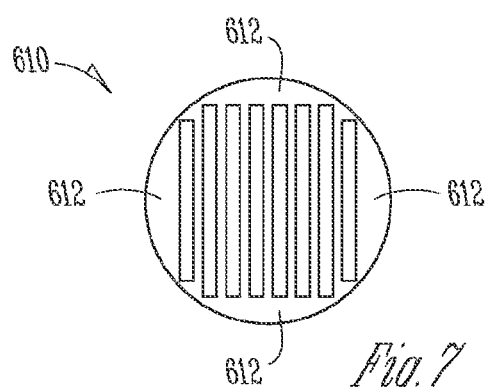
FIG. 7 shows a top view of a cylindrical system according to at least one embodiment of the invention.

Substantially rectangular molds provide the ability to increase a capacity of the mold 600 by increasing the length 603 of the long side walls 602. The width 605 of the short side walls 604 can remain at a standard size (e.g. 2 meters in selected examples) and additional heating elements 606 can be added to the mold and top heater configurations to accommodate the increased length 603. This configuration provides an easy method to scale up a manufacturing process, and make larger silicon ingots with reduced manufacturing costs and time. In one example, a rectangular mold provides a single batch size of 5-6 metric tons, where a cylindrical mold using similar size heating elements (such as shown in FIG. 7) provides a batch size of approximately 1.4 metric tons.

In addition, the substantially rectangular shape of the mold 600 better matches an areal pattern of the heating elements 606. Cylindrical mold designs with a circular top area are more difficult to cover with linear heating elements 606. FIG. 7 shows gaps 612 that lead to less consistent heat control of a surface of molten silicon in cylindrical mold 610.

In addition, the substantially rectangular shape of the mold 600 provides for the ability to adjust an amount of contact that the ingot has with side walls of the mold 600 during the directional solidification process. In some processes, contamination from side walls of a mold reduces a quality of the ingot. One example includes aluminum contamination from aluminum oxide refractory watts of a mold. By making the mold 600 longer, using a substantially rectangular configuration, the ingot can be made with increased contact with a bottom of the mold, and reduced contact with side walls of the mold 600. In one example, a bottom of the mold 600 is made from a material, such as silicon carbide, that has a much lower, or non-existant contribution to contamination of the silicon.

For example, a 2 meter diameter cylindrical mold provides a surface area of $\pi \cdot (r^2) = \pi \cdot (d/2)^2 = \pi$. Because wall contact area is directly related to a height (h) of the molten silicon, for a given volume of silicon ($\pi \cdot h$ for a cylindrical mold), ($x \cdot y \cdot h$ for a rectangular mold), a substantially rectangular mold having a surface area ($z \cdot y$) greater than or equal to $\pi$ will have a wall contact area that is smaller than the wall contact area for the cylindrical mold. For a substantially rectangular mold having one dimension equal to 2 meters, a second dimension larger than $\pi/2$ meters provides a smaller wall contact area than a cylindrical mold with a diameter equal to 2 meters.

Figure 8:
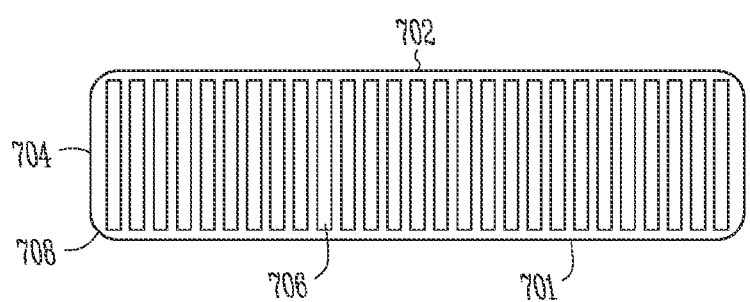
FIG. 8 shows a top view of a rectangular system according to at least one embodiment of the invention.

FIG. 8 shows a mold 700 according to another embodiment of the invention. The top view of the mold 700 shows a wall structure 701, including long side walls 702 and short side walls 704. In one example, both the long side walls 702 and the short side walls 704 are formed from thermally insulating material, such as a refractory material. As discussed in embodiments, above, in one example, the refractory material includes aluminum oxide, substantially in the form $Al_2O_3$. A number of heating elements 706 are shown in a configuration to be included within a rectangular top heater to cover the mold 700 during a directional solidification process. The mold in FIG. 8 includes a rounded profile at corners 708.

In one example, the addition of rounded corners provides a reduction in stress concentration at the corners. During a directional solidification process, forces, such as thermal expansion and contraction of silicon, can strain the mold 700. The addition of rounded corners 708 reduces cracking or other failure in the mold, which frequently includes brittle refractory materials such as aluminum oxide, etc. as discussed in embodiments above.

Figure 9:
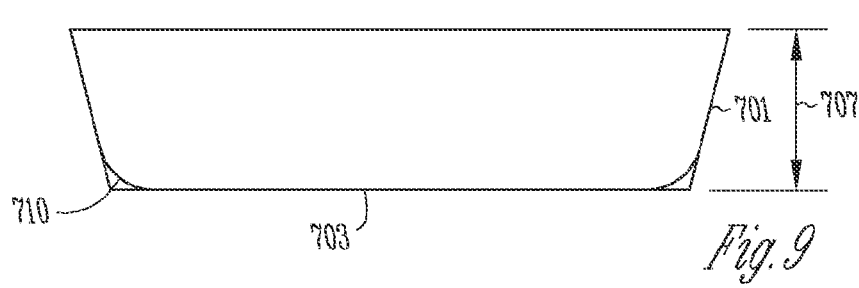
FIG. 9 shows a side view of the system from FIG. 8.

FIG. 9 shows a side view of the mold 700 from FIG. 8. In addition to the rounded corners 708, in one embodiment, the mold 700 includes a rounded profile 710 at the intersection of the rectangular shaped wall structure 701 and a base 703. In one example, a height 707 of the mold 700 is approximately 40 centimeters, with an ingot height within the mold 700 of approximately 33 centimeters.

Figure 10:
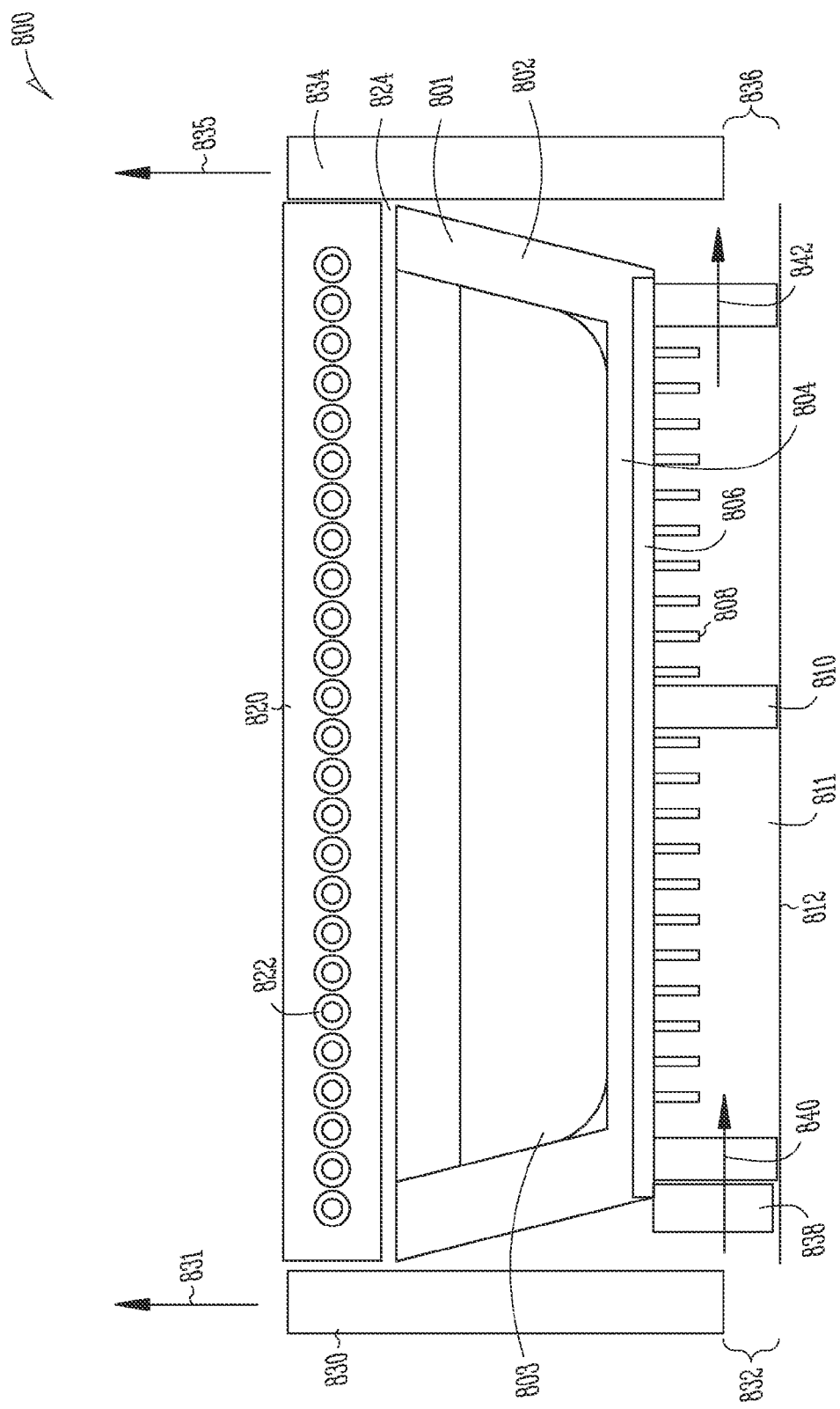
FIG. 10 shows a side view of a system according to at least one embodiment of the invention.

FIG. 10 shows a directional solidification system 800 according to embodiment of the invention. A mold 801 is defined by a wall structure 802 and a base 804. The mold 801 is adapted to contain a volume of molten silicon 803, and to cool the molten silicon 803 in a directional solidification process. The system 800 also includes atop heater 820 to control the thermal gradient and cooling rate of the molten silicon 801. The top heater 820 is shown with a number of heating elements 822, similar to top heaters described above in other embodiments. Similar to examples described above, in one configuration the wall structure 801 includes a taper in thickness from a rim of the mold 801 to an interface with the bottom 804.

A support structure 810 is shown holding the mold 801 a distance above a floor surface 812 to define a space 811. In one example, a flow of air or other cooling media is controlled within the space 811 to control the rate of cooling at the base 804 of the mold 801. In one example, one or more flow pathways are provided to move air or other cooling media within the space 811. In FIG. 8, a first flow pathway 840 and a second flow pathway 842 are shown. Although two flow pathways (e.g. inlet and outlet) are used in selected examples, other examples include more than two flow pathway, or only a single flow pathway. A single flow pathway may serve as an inlet and an outlet at the same time.

FIG. 10 also includes a circulation device 838 such as a fan or other active mover of air or other cooling media. Also shown in FIG. 10 are a first valve 830 and a second valve 834. The first valve 830 is movable in direction 831 to adjust a space 832 and provide metered access to the space 811 beneath the mold 801. Similarly, the second valve 834 is movable in direction 835 to adjust a space 836 and provide metered access to the space 811 beneath the mold 801. In operation, one or more valves such as valves 830 and 834 are moved to change circulation and cooling conditions within the space 811. In one example a rate of the circulation device 838 can also be varied along with the one or more valves such as valves 830 and 834.

In one example, a number of cooling structures (e.g. fins) are located within the space 811 and coupled to the base 804 of the mold 801. The cooling structures increase the ability to conduct heat away from the base 804 of the mold. However, if the space 811 is closed by valves 830 and 834, less cooling will occur at the base 804.

In one example, a metal heat spreading layer 806 is further included within the base 804. In one example, the base 804 includes a silicon carbide layer for contact with the molten silicon 803, and the metal heat spreading layer 806 is located apart from the molten silicon 803. In operation, a metal heat spreading layer 806, such as a steel layer, conducts heat more quickly than silicon carbide, and is included to enhance the cooling process at the base 804. In one example, the metal heat spreading layer 806 includes a layer approximately 3 centimeters thick. A thick metal heat spreading layer 806 provides a good pathway to conduct heat away from the base 804 and to encourage directional solidification in a desired solidification profile, such as the example profiles in FIG. 5.

As shown in FIG. 10, in one example the valves 830 and 834 include insulating walls that cover both the walls 802 of the mold 801 and optionally cover access to the space 811 beneath the mold 801. The additional coverage adjacent to the walls 802 of the mold 801 further insulates the molten silicon 803 in the region against the walls 802 and prevents less desirable solidification on the walls before solidification at the base 804. In one example the insulating walls of the valves 830 and 834 also cover an interface 824 between the mold 801 and the top heater 820. This configuration provides additional protection against thermal loss at this interface 824. Examples of valve materials include refractory materials or other thermally insulating materials such as those described in embodiments above.

In operation, the valves 830 and 834 can be controlled in a number of ways. In one example the valves 830 and 834 provide an adjustable space 832, 804 that is set once during the directional solidification process. In one embodiment, one or more valves 830 and 834 are set to move at a continuous rate in directions 831, 835 to progressively open the pathways 840, 842. Movement of the valves 830 and 834 may be at the same rate for each valve, or the valves may operate at different rates. The rate of the valves 830 and 834 may be linear, or the rate may vary during the directional solidification process.

By using variables such as the circulation device 838, the valves 830 and 834, the top heater 820, the tapered wall structure 802, the metal heat spreader 806, and fins 808, a rate and profile of cooling for the molten silicon 803 can be precisely controlled. Control of the rate and profile of cooling provides a number of advantages, such as increased efficiency of impurity segregation. Using configurations an methods described above, silicon can be processed in fewer directional solidification steps, and larger batches of silicon can be processed to produce larger ingots with higher purity and at a faster processing rate.

FIG. 11 shows a system 900 including a mold 902 and a removable heat spreader 910. The mold 902 includes a rim 904 and a bottom 906. In some directional solidification operations, the large thermal gradients experienced by molds 902 can cause warping, and damage to heat spreading structures located on a bottom of the mold 902. If repairs are needed on a warped mold with an integral heat spreader, the entire mold must be taken out of production while it is being repaired. In the example configuration illustrated in FIG. 11, a warped or damaged removable heat spreader 910 can be removed for repair, and a spare removable heat spreader 910 can be quickly attached to keep the mold 902 available for production while the warped or damaged removable heat spreader 910 is repaired.

In the bottom view of the removable heat spreader 910. In one example, a number of cooling fins 914 are included. In one example, a transport system, such as slots for a fork lift, or other transport system are included on the removable heat spreader 910. Attachment points 912 can be used to couple the removable heat spreader 910 to the bottom 906 of the mold 902. Examples of coupling methods include using latches, fastening hardware, or other fastening systems. Examples of fastening hardware include, but are not limited to, bolts, screws, nuts, rivets, or other suitable fastener where the removable heat spreader 910 is separately removable from the bottom 906 of the mold. In one example, a sacrificial fastener, such as a rivet, is used, wherein the removable heat spreader 910 is removed by cutting, or otherwise destroying the sacrificial fastener, and new sacrificial fasteners are used to re-attach the removable heat spreader 910. Configurations using a sacrificial fastener are easier to remove than a welded integral heat spreader, yet secure in holding the removable heat spreader 910 against the bottom 906 of the mold 902.

In addition to the ability to quickly replace a warped or damaged removable heat spreader 910, because the removable heat spreader 910 is only attached to the mold 902 at a selected number of attachment points 912, the removable heat spreader 910 is allowed a certain amount of freedom to expand and contract under thermal stress, independent of the mold 902, which reduces the cause of warping. In selected examples, the attachment points 912 include slotted, or oversized openings, which allow the removable heat spreader 910 additional freedom of movement to expand and contract around fasteners (latches, fastening hardware, etc.), independent of the mold 902.

A removable heat spreader 910 and mold 902 of a number of different shapes are within the scope of the invention. For example, a substantially cylindrical mold and corresponding heat spreader may be used. In another example, a rectangular removable heat spreader may be coupled to a rectangular mold, similar to molds 600, 700, or 801 as described above.

While a number of embodiments of the present subject matter have been described, the above embodiments are not intended to be exhaustive. It will be appreciated by those of ordinary skill in the art that any arrangement configured to achieve silicon purification using directional solidification techniques, while maintaining consistent progression of a solid-liquid interface throughout a mold can be substituted for the specific embodiment shown. Combinations of the above embodiments, and other embodiments, will be apparent to those of skill in the art upon studying the above description. This application is intended to cover any adaptations or variations of the present subject matter. It is to be understood that the above description is intended to be illustrative and not restrictive.

What is claimed is:

1. A system for directional solidification, comprising:
   a mold, including:
      an outer jacket;
      a base positioned to directly contact molten material, the base lining a bottom of the outer jacket, the base including a heat conducting material of a higher thermal conductivity than a wall material positioned to directly contact molten material; and
      a wall insulation structure positioned to directly contact molten material, the wall insulation structure lining a wall of the outer jacket, the wall insulation structure tapering in thickness from a rim of the mold, having a first thickness, to a bottom portion of the mold, having a second thickness that is thinner than the first thickness.

2. The system of claim 1, wherein the wall insulation structure tapers in thickness from the rim of the mold to a bottom interface with the base.

3. The system of claim 2, wherein the second thickness is approximately 25 percent thinner than the first thickness.

4. The system of claim 1, wherein the wall insulation structure includes a layer of refractory bricks, and an exposed layer of substantially continuous refractory material.

5. The system of claim 1, further including a top heater.

6. The system of claim 5, wherein the top heater includes a number of silicon carbide heating elements.

7. The system of claim 5, further including a vent hole in the top heater.

8. A mold for directional solidification, comprising:
   a substantially rectangular shaped wall structure, including a long side and a short side;
   a heat conducting base positioned to directly contact molten material, the base including a material of a higher thermal conductivity than a wall material, coupled to the substantially rectangular shaped wall structure;
   wherein the substantially rectangular shaped wall is dimensioned to provide a wall contact area for a given quantity of molten silicon that is less than a wall contact area for a cylindrical mold having a diameter substantially equal to a length of the short side of the mold; and
   wherein the substantially rectangular shaped wall structure is positioned to directly contact molten material, and the rectangular shaped wall structure tapers in thickness from a rim of the mold, having a first thickness, to a bottom interface with the heat conducting base, having a second thickness that is thinner than the first thickness.

9. The mold of claim 8, wherein the rectangular shaped wall structure includes a rounded profile at wall intersections.

* * * * *